US008013646B2

(12) United States Patent (10) Patent No.: US 8,013,646 B2
Millar (45) Date of Patent: *Sep. 6, 2011

| (54) | TIMING VERNIER USING A DELAY LOCKED LOOP |
|---|---|
| (75) | Inventor: Bruce Millar, Stittsville (CA) |
| (73) | Assignee: Mosaid Technologies Incorporated, Ottawa, Ontario (CA) |
| (*) | Notice: Subject to any disclaimer, the term of this patent is extended or adjusted under 35 U.S.C. 154(b) by 0 days. |
| | This patent is subject to a terminal disclaimer. |
| (21) | Appl. No.: 12/950,305 |
| (22) | Filed: Nov. 19, 2010 |
| (65) | Prior Publication Data |
| | US 2011/0063006 A1 Mar. 17, 2011 |

Related U.S. Application Data

(60) Continuation of application No. 12/687,541, filed on Jan. 14, 2010, now Pat. No. 7,863,954, which is a continuation of application No. 12/144,186, filed on Jun. 23, 2008, now Pat. No. 7,671,650, which is a continuation of application No. 11/550,245, filed on Oct. 17, 2006, now Pat. No. 7,391,247, which is a division of application No. 11/205,082, filed on Aug. 17, 2005, now Pat. No. 7,129,760, which is a continuation of application No. 11/037,365, filed on Jan. 19, 2005, now Pat. No. 7,038,517, which is a continuation of application No. 10/402,130, filed on Mar. 31, 2003, now Pat. No. 6,853,231.

(51) Int. Cl.
 *H03L 7/06* (2006.01)
(52) U.S. Cl. ......... 327/158; 327/172; 327/277; 327/278
(58) Field of Classification Search ................ 327/158, 327/172–176, 276–278
 See application file for complete search history.

(56) References Cited

U.S. PATENT DOCUMENTS

| 5,684,421 | A | 11/1997 | Chapman et al. |
| 6,052,011 | A | 4/2000 | Dasgupta |
| 6,121,826 | A | 9/2000 | Dosho et al. |
| 6,292,040 | B1 | 9/2001 | Iwamoto et al. |
| 6,388,482 | B1 | 5/2002 | Schnell et al. |

(Continued)

OTHER PUBLICATIONS

U.S. Appl. No. 12/144,186, Notice of Allowance dated Oct. 15, 2009.
U.S. Appl. No. 12/687,541, Notice of Allowance dated Aug. 20, 2010.

*Primary Examiner* — Lincoln Donovan
*Assistant Examiner* — William Hernandez
(74) *Attorney, Agent, or Firm* — Shin Hung; Borden Ladner Gervais LLP

(57) ABSTRACT

A method for synchronizing a plurality of programmable timing verniers with a reference pulse signal, each of the verniers being programmable to one of a plurality of timing steps within a delay range determined by a control signal applied to a bias input. A first and second control vernier is selected from the plurality of verniers, the first control vernier is programmed to a first delay, and the second control vernier is programmed to a second delay. The first and second control verniers are triggered together to generate respective first and second delay signals. A difference pulse signal is generated with a duty cycle corresponding to a difference between the generated first delay signal and second delay signal. The duty cycle of the pulse signal is compared to a duty cycle of the reference pulse signal to generate a difference signal pulse. The difference signal pulse is coupled to the bias input of the verniers to adjust the delay range, such that the duty cycle of the difference signal approaches the duty cycle of the reference pulse signal.

30 Claims, 12 Drawing Sheets

U.S. PATENT DOCUMENTS

| | | |
|---|---|---|
| 6,483,871 B1 | 11/2002 | Dawe |
| 6,680,635 B2 | 1/2004 | Lee |
| 6,768,690 B2 | 7/2004 | Kwon et al. |
| 6,774,694 B1 | 8/2004 | Stern et al. |
| 6,819,190 B2 | 11/2004 | Pearce et al. |
| 6,950,487 B2 | 9/2005 | Lin et al. |
| 7,288,977 B2 | 10/2007 | Stanley |
| 2006/0164142 A1 | 7/2006 | Stanley |

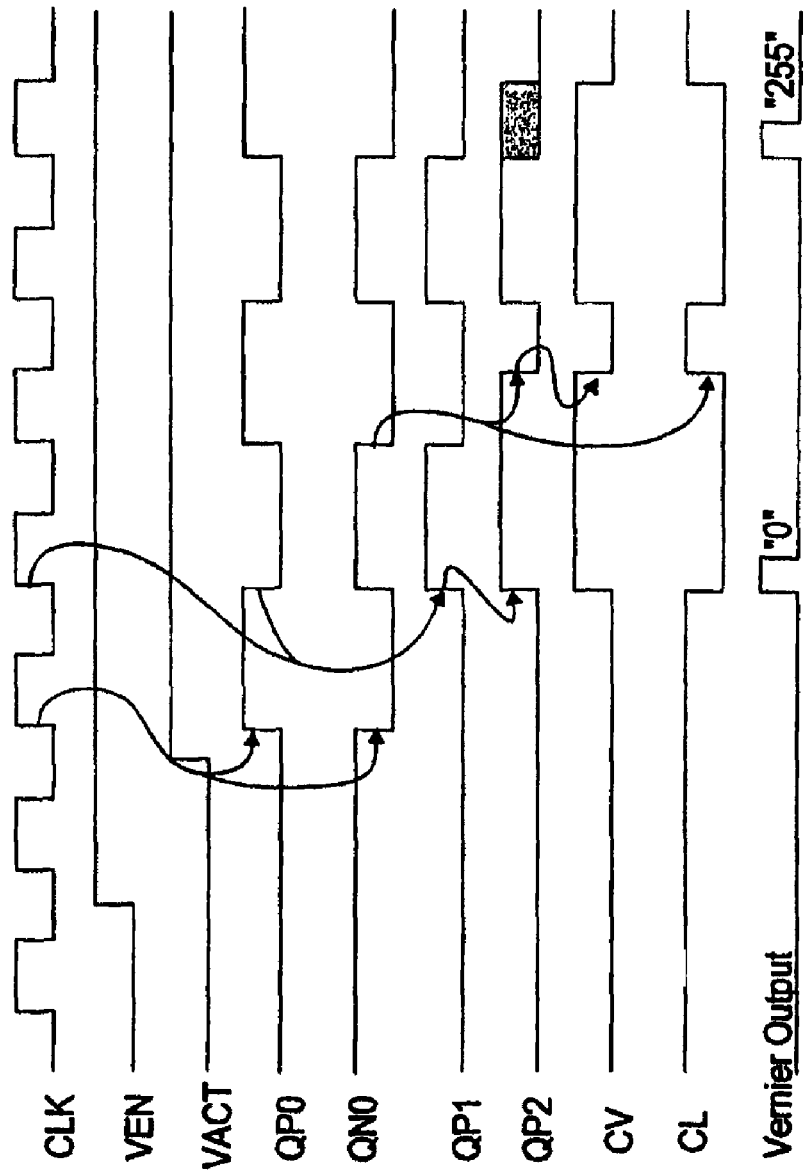

TIMING VERNIER USING A DELAY LOCKED LOOP

CROSS REFERENCE TO RELATED APPLICATIONS

This application is a continuation of U.S. application Ser. No. 12/687,541 (now issued as U.S. Pat. No. 7,863,954), filed on Jan. 14, 2010, which is a continuation of U.S. application Ser. No. 12/144,186, (now issued as U.S. Pat. No. 7,671,650) filed on Jun. 23, 2008, which is a continuation of U.S. application Ser. No. 11/550,245 (now issued as U.S. Pat. No. 7,391,247), filed on Oct. 17, 2006, which is a divisional of U.S. application Ser. No. 11/205,082 (now issued as U.S. Pat. No. 7,129,760), filed Aug. 17, 2005, which is a continuation of U.S. application Ser. No. 11/037,365 (now issued as U.S. Pat. No. 7,038,517), filed Jan. 19, 2005, which is a continuation of U.S. application Ser. No. 10/402,130 (now issued as U.S. Pat. No. 6,853,231), filed Mar. 31, 2003, which is incorporated herein by reference in its entirety.

FIELD OF THE INVENTION

The present invention relates to a system and method for generating timing signals, and more particularly to delay locked loop (DLL) controlled timing vernier (delay generator) for generating such timing signals.

BACKGROUND OF THE INVENTION

The generation of timing signals with fine resolution time delays finds important application in Automated Test Equipment (ATE) that is used for testing integrated circuit devices, where precise timing edge placement is required. A typical test requires that data from a Device Under Test (DUT) must be compared with expected data at a precisely controlled time and for a precisely controlled period. For example a tester might expect a signal on a data pin of the DUT to be low 2.435 ns after receipt of a trigger signal for a time period of 500 ps.

Typical ATEs use a timing vernier (essentially a delay generator) to generate these fine timing resolution signals from a precisely generated fixed frequency global clock signal. The timing vernier is essentially a delay generator capable of generating very small phase shifts, usually in the order of picoseconds, of the global clock signal. Timing verniers are useful because the available timing resolution is determined by the difference between two precisely controlled propagation delay values, it is not constrained by minimum gate propagation delay.

Commercially available timing vernier devices are typically programmable via an eight bit code and can be retriggered at frequencies in the order of several hundred MHZ. The minimum resolution timing step of the vernier is determined by its minimum delay range divided by 255 (for an 8-bit code). However any number of bits (e.g. 16) may be used to subdivide the delay range. The delay range of the vernier is usually externally adjustable within its minimum delay range and maximum delay range (dynamic range), by a current reference signal or a bias voltage signal.

Generally several timing verniers are used to divide the period of the global clock signal into several time slots. In typical ATE's the fixed frequency global clock signal is sent to all timing verniers from which all signal generation and sampling are measured. A disadvantage of a fixed frequency system is that the time slots are fixed relative to the period of the global clock signal.

Modern ATE's are required to test a wide variety of devices and thus there is a need for testers to operate over a wider frequency range in order to test this variety of devices.

Previous ATEs approached the problem of variable tester clock frequencies by computing the difference or remainder in delay between edges of the fixed global clock signal and the variable test clock signal and to compensate for this difference by using calibrated verniers. When the sum of the remainders is greater than one clock cycle, an additional clock cycle is inserted into the variable test clock signal. This requires complex control logic and is difficult to operate reliably.

A further problem is that because multiple timing verniers are used to generate tester clock frequencies process variations and temperature variations cause the vernier delays to drift and limits their resolution. This problem is particularly exacerbated by varying the frequency of the global clock signal.

Accordingly there is need for a timing vernier that may be locked to a variable frequency clock and that is minimally susceptible to process and operating condition variations.

Furthermore there is a need for a method for synchronizing multiple verniers to accommodate a variable frequency clock and to also reduce susceptibility to fluctuations in supply voltages.

SUMMARY OF THE INVENTION

In accordance with a general aspect of the invention there is provided a method for synchronizing a plurality of programmable timing verniers with a reference signal, each vernier being programmable to one of a plurality of timing steps within a delay range and the delay range being determined by a control signal applied to a bias input, the method comprising the steps of: (a) providing a first and second control vernier; (b) programming the first control vernier to a first delay; (c) programming the second control vernier to a second delay; (d) triggering the first and second control verniers together to generate respective first and second delay signals; (e) generating a first difference signal corresponding to a difference between the generated first delay signal and second delay signal; and (f) comparing the first difference signal to a reference signal to generate a second difference signal, the second difference signal being coupled to the bias input of the verniers to adjust the delay range.

In an embodiment the first difference signal is a pulse and the second reference signal is also a pulse.

In accordance with one aspect of this invention there is provided a method for synchronizing a plurality of programmable timing verniers with a reference pulse signal, each of the verniers being programmable to one of a plurality of timing steps within a delay range and the delay range being determined by a control signal applied to a bias input, the method comprising the steps of: (a) selecting a first and second control vernier from the plurality of verniers; (b) programming the first control vernier to a first delay; (c) programming the second control vernier to a second delay; (d) triggering the first and second control verniers together to generate respective first and second delay signals; (e) generating a difference pulse signal having a duty cycle corresponding to a difference between the generated first delay signal and second delay signal; (f) comparing the duty cycle of the pulse signal to a duty cycle of the reference pulse signal to generate a difference signal pulse, the difference signal being coupled to the bias input of the verniers to adjust the delay range such that the duty cycle of the difference signal approaches the duty cycle of the reference pulse signal.

In accordance with another aspect of this invention there is provided a system for synchronizing a plurality of programmable timing verniers with a reference pulse signal, each vernier being programmable to one of a plurality of timing steps within a delay range and the delay range being determined by a control signal applied to a bias input, the system comprising: (a) first and second control verniers selected from the plurality of verniers, and being programmed to respective first delay and second delays; (b) a pulse generator for generating a difference pulse signal having a duty cycle corresponding to a difference between a generated first delay signal and second delay signal; (c) a duty cycle detector for comparing the duty cycle of the pulse signal to a duty cycle of the reference pulse signal to generate a difference signal pulse; and (d) a feed back circuit for coupling the difference signal back to the bias inputs of the verniers to adjust the delay range such that the duty cycle of the difference signal approaches the duty cycle of the reference pulse signal.

In an embodiment the duty cycle detector compares the duty cycle of a pulse generated from the difference between the vernier minimum delay and the vernier maximum delay and a pulse that is one clock cycle long. The duty cycle detector generates a bias voltage, which is fed back to the timing verniers. This bias voltage controls the delay through the timing vernier.

In a still further embodiment the control signals are distributed to the verniers as current signals.

In a still further embodiment the timing verniers are arranged in groups with each group having a local current to voltage conversion circuit.

In a still further embodiment the groups include local calibration.

Since verniers may be used to divide a clock period into a predefined number of segments. As the clock frequency changes the bias voltage is adjusted to keep the correct number of predefined segments.

An advantage of the present invention is the ability to synchronize multiple verniers to a variable frequency clock signal.

Another advantage of the present invention is that multiple timing verniers may be synchronized while minimizing their dependence on variable operating conditions such as temperature and process variations.

Another advantage of the present invention is that the delay range of the programmable timing verniers can be locked to a variable frequency clock, which is particularly useful in ATE's.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 12 is a timing diagram showing operation of the circuit in FIG. 7.

DETAILED DESCRIPTION

In the following description, numerous specific details are set forth to provide a thorough understanding of the invention. However, it is understood that the invention may be practiced without these specific details. In other instances, well-known structures circuits or and/or processes have not been described or shown in detail in order not to obscure the invention. In the description and drawings, like numerals refer to like structures or processes.

Figure 1:
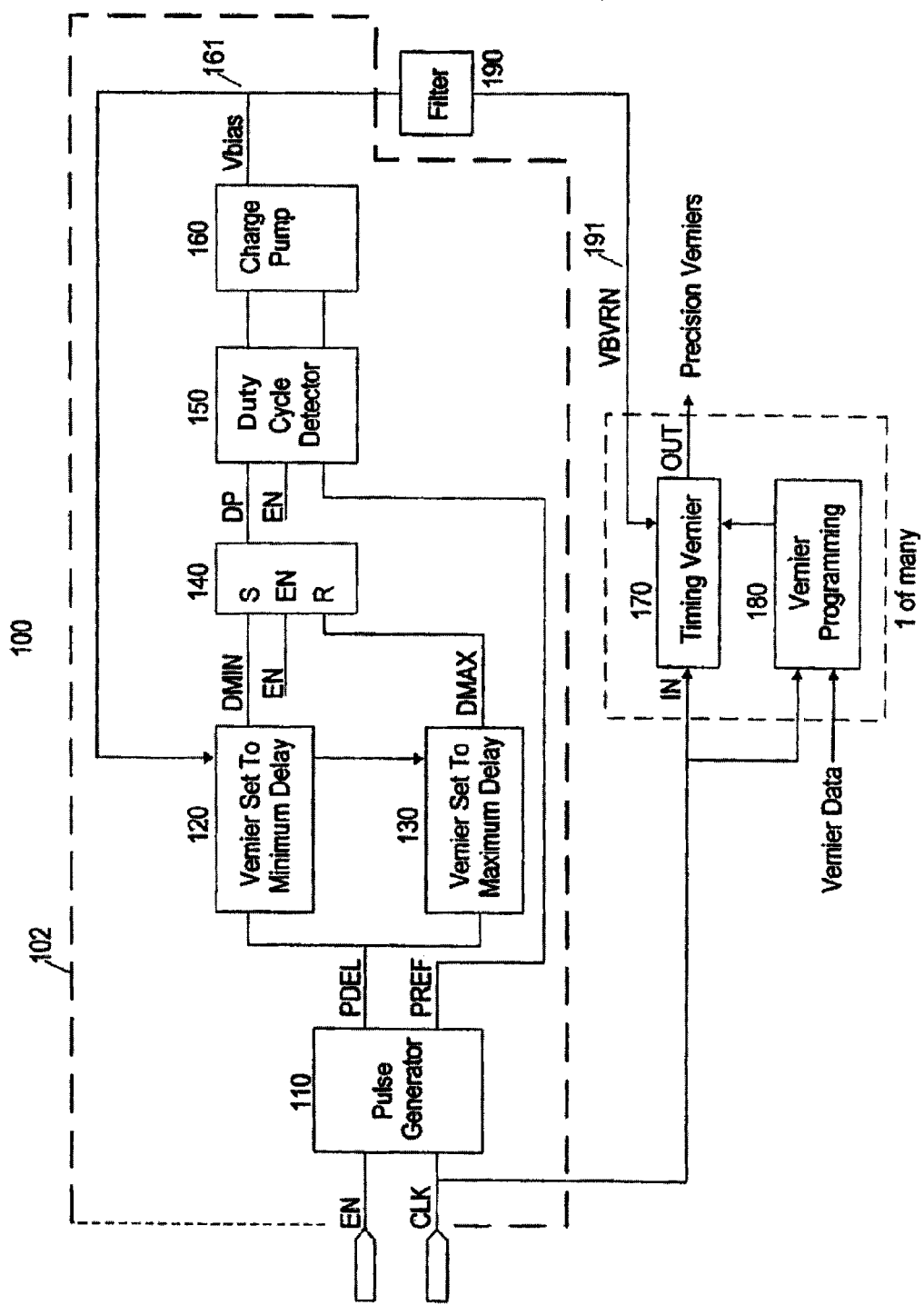
FIG. 1 is a schematic block diagram of a timing vernier control system according to an embodiment of the present invention.

Referring now to FIG. 1 there is shown a timing vernier system 100 in accordance with an embodiment of the invention. The system 100 includes a delay locked loop (DLL) 102 for providing a delay compensated control signal to a plurality of programmable timing verniers 170 on a semiconductor device. Each vernier 170 receives a global clock signal CLK and the control signal, which is a filtered bias voltage VBVRN 191 for setting its delay range. Each timing vernier 170 may be programmed to one of 256 within the delay range by an 8-bit code applied to a vernier programming circuit 180. The vernier programming circuit 180 receives the global clock CLK and the 8-bit code on a vernier data bus input. The programming circuit 180 includes registers and a decoder in order to generate the appropriate programming signals to the vernier 170, these circuits are well known in the art, and will not be discussed further. In summary, the total delay across each vernier is controlled by the bias voltage VBVRN applied to the vernier and the number of steps programmed into the programming control.

Figure 5:
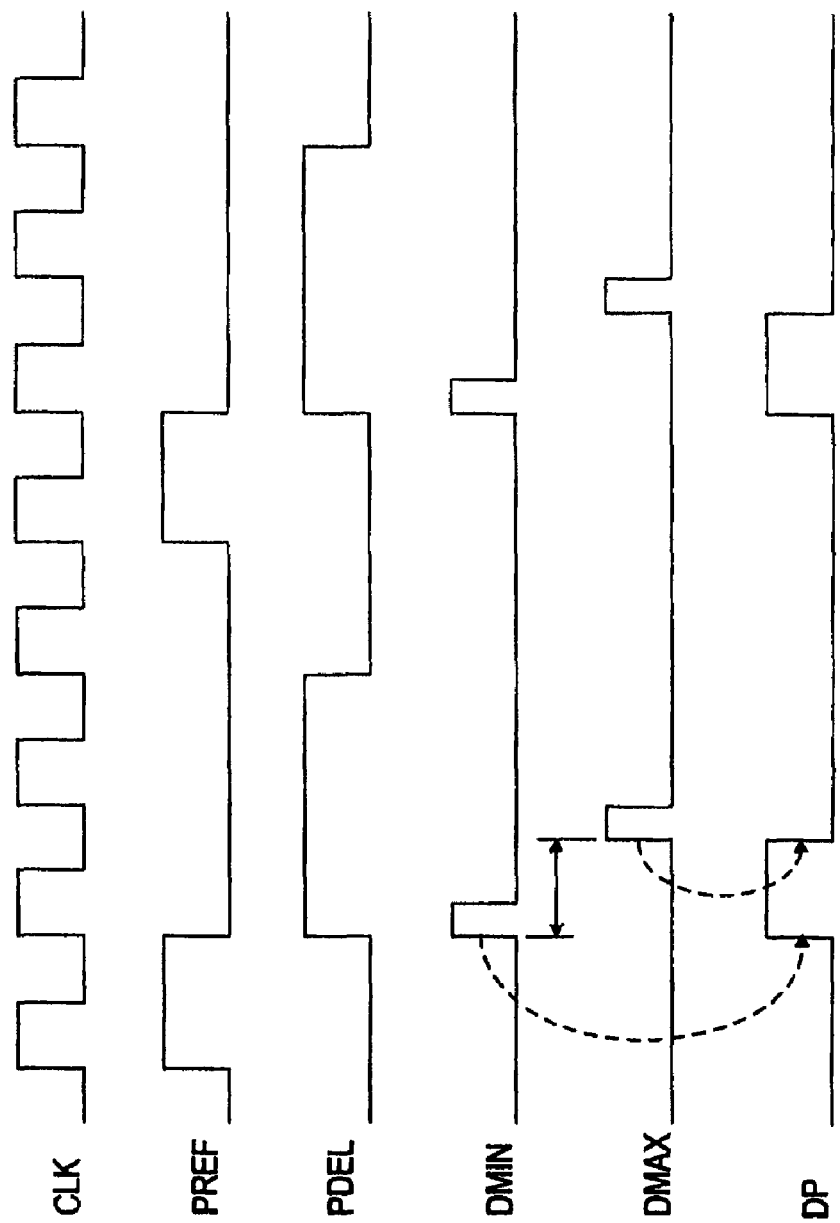
FIG. 5 is a timing diagram.

A delay line for the delay locked loop circuit 102 is comprised of two control verniers 120 and 130 which are duplicates of the timing verniers 170. The clock signals to these control verniers are derived from a pulse generator 110. The global clock signal is fed to the pulse generator 110. The pulse generator produces a delay signal PDEL and a reference signal PREF as shown in FIG. 5. The signal PREF is a positive pulse of one clock cycle in duration and which is generated every four cycles of the clock signal CLK. The PDEL signal is simply the clock signal CLK divided by four. The PDEL signal is coupled to the clock input of each control vernier 120 and 130. Control timing vernier 120 is programmed to the verniers minimum range delay and produces an output pulse signal DMIN. The control timing vernier 130 is programmed with the full range delay of the verniers and produces output pulse signal DMAX. The pulse DMIN occurs first as it has the minimum delay path and is coupled to a set input of an SR Flip-Flop 140 causing the output DP of the flip-flop to go high. The pulse DMAX occurs after pulse DMIN and is coupled to the reset input of the SR Flip-Flop causing the output DP of the flip-flop to go low. Thus the output DP of the flip-flop generates a pulse signal that corresponds to the difference in the delay between the minimum delay vernier 120 and the maximum delay vernier 130. Thus the length of the DP pulse corresponds to the delay span or range of the timing verniers.

The output pulse DP from the SR flip-flop is coupled to a duty cycle detector 150 which compares the duration of the DP pulse with the PREF pulse. The DP and the PREF pulses are preferably non overlapping. The output of the duty cycle detector 150 drives a charge pump 160, which in turn generates a voltage VBIAS, which is fed back to the control vernier 120 and 130. The DP pulse causes VBIAS to move in one direction and then the PREF causes it to move in the other direction. Thus voltage VBIAS has a voltage ripple.

A bias voltage filter 190 having a large time constant is used to remove the voltage ripple from the signal VBIAS and generate the vernier bias voltage signal VBVRN 191 which is provided to the timing verniers 170. If this filter was not present the voltage ripple on VBIAS would phase modulate the timing of the verniers 170. The Filter 190 also isolates the VBIAS feedback loop from the capacitive load of the timing verniers. The capacitive load of the timing verniers has the potential to destabilize the control feedback loop.

The delay locked loop will stabilize when the length of the DP pulse is the same length as the PREF pulse. This requires that the difference between a maximum delay vernier and a minimum delay vernier is one clock cycle. This means that the delay range for all other verniers on the chip has been set to 1 clock cycle.

One advantage of this system is that it will compensate for temperature and supply voltage changes, since changes in the timing verniers will be reflected in the control verniers which in turn will adjust the bias control of the verniers.

Another advantage is that it also permits the system to vary the clock frequency and the verniers will automatically be readjusted to fully subdivide the clock into a predetermined number of segments.

Figure 2:
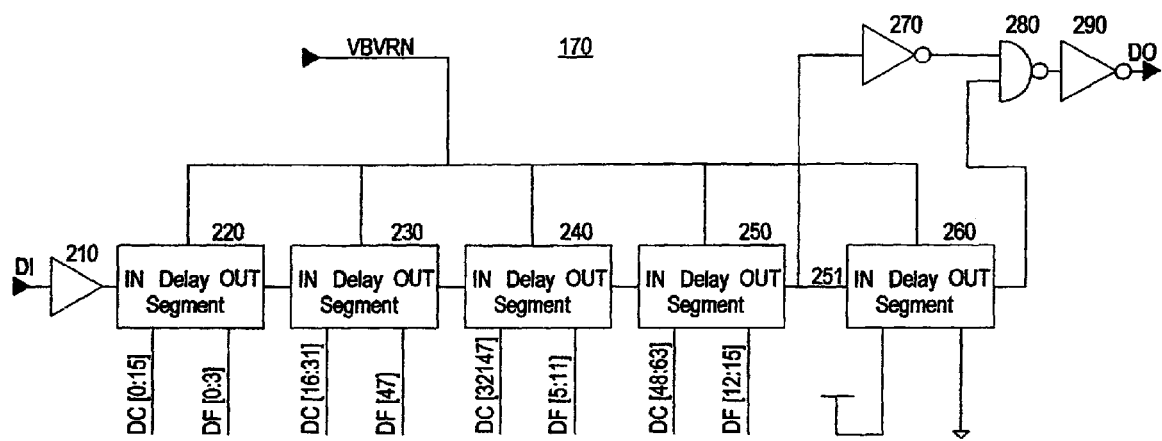
FIG. 2 is a block diagram of a programmable timing vernier according to an embodiment of the present invention.

Referring to FIG. 2 there is shown a circuit diagram of the programmable timing vernier 170 according to an embodiment the present invention. A delay input DI is connected to a first of a series cascade of delay segments 220, 230, 240, 250 via inverter 210. Each delay segment is programmable and has sixteen coarse programming bits D [0:15] and four fine programming bits D [0:3] etc. The delay segments are also responsive to a bias voltage VBVRN for setting their individual delay range. A delayed version of the inverted input signal is coupled from a node 251 in the delay cascade where it is connected to inverter 270 and delay segment 260.

The output of the inverter 270 and the delay segment 260 are coupled to inputs of a NAND gate 280, which outputs via an inverter 290 a pulse signal DO. As may be seen the inverter 270, NAND gate 280, inverter 290 and delay segment 260 form a pulse generator. The width of the output pulse DO is determined by the delay through delay segment 260.

One advantage of using the delay segment 260 to generate the length of this pulse, rather than a more typical delay chain is that the width of the pulse will be a known fraction (up to ¼) of a clock cycle. As described above the circuit of FIG. 1 is used to set the bias voltage level so that the delay through a timing vernier programmed to maximum delay (the delay mostly made up of four timing segments) is one clock cycle long. Therefore the delay through one timing segment which is programmed to a maximum delay will be ¼ of the clock period. If delay segment is programmed to a mid point delay then the pulse width will be ⅛ of the clock period. This pulse width programming is shown in FIG. 2 by coupling the programming inputs of the delay segment 260 to the appropriate supply voltages.

As will be recognized by those skilled in the art, the circuit of FIG. 2 generates a positive output pulse DO in response to a rising edge on the input DI.

Figure 3:
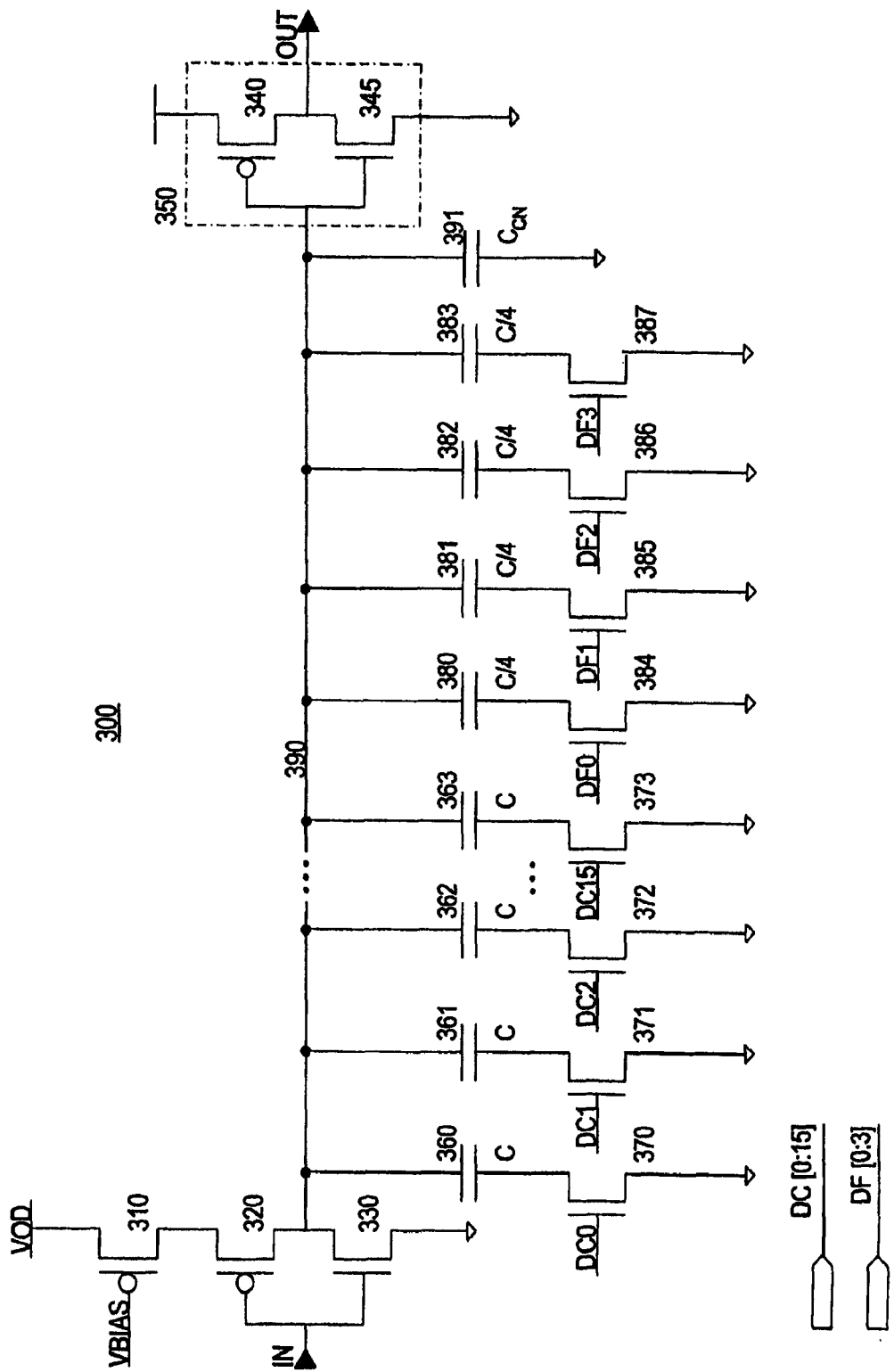
FIG. 3 is a circuit diagram of a delay segment according to an embodiment of the present invention.

Referring to FIG. 3 there is shown a schematic diagram of the delay segment 220 of FIG. 2, generally indicated by numerals of 300, according to an embodiment of the present invention. The input signal is coupled via an input terminal IN to the gates of transistors 320 and 330, which form an input inverter. A high voltage supply line is connected to the source of transistor 310. When transistor 320 is on (a low voltage on its gate) current will flow from VDD to node 390. The magnitude of this current will be controlled by the bias voltage VBIAS on the gate of transistor 310. If VBIAS is lower, then more current will flow through the transistor.

The transistors 320 and 330 output a signal onto the node 390 which is connected to capacitors 360 383 and the gates of transistors 340 and 345. Transistors 340 and 345 form inverter 350. Each of the capacitors 360 383 is controlled by its respective transistor 370 387 form a programmable capacitive element. If a signal DC applied to the gate of the transistor 370 is high then the full capacitance C of capacitor 360 is connected between the node 390 and ground. If the signal DC is low, then transistor 370 is off. Node 390 sees a series capacitance of capacitor 360 and the parasitic drain capacitance (Cf) of transistor 370 between itself and ground. The value of that capacitance is $C*Cf/(C+Cf)$. Additionally, node 390 has a parasitic capacitance Ccn 391.

The coarse programming bits are each connected to a programmable element with a capacitor of size C. The fine programming signals are connected to programmable elements with capacitor sizes of C/4 and parasitic capacitance of Cf/4 as transistors 384 to 387 are preferably ¼ the size of transistors 370 to 373. The capacitors are preferably Metal Insulator Metal or MIM capacitors rather than MOS type capacitors.

The operation of the delay segment may be explained as follows. When the signal applied to the input terminal IN is low, transistor 320 is turned on. This permits current to flow from VDD to node 390. The bias voltage (VBIAS) on the gate of transistor 310 determines this current. This current charges the node 390 and its connected capacitance. As the current charges the capacitance the voltage on node 390 begins to rise. The amount of time it takes to charge is proportional to the capacitance and inversely proportional to the current. If there are more capacitors connected, it takes longer. When the voltage on node 390 reaches the switching point of inverter 350 the output is driven low. When the input signal is high transistor 320 is off and transistor 330 is on. The charge on node 390 flows to ground and the voltage on node 390 falls. When the switching point of inverter 350 is reached the output goes high. Transistor 330 is sized so that it can quickly discharge the node 390.

In one embodiment, each delay element may be programmed to one of sixty-four possible delays. The programming sequence is one fine bit, two fine bits, three fine bits, one course bit, one course and one fine bit, and so on up to 16 course bits. The capacitors are physically positioned in arrays of four wide. The fourth unused fine bit is present for physical symmetry. The importance of maintaining physical symmetry in precision capacitance arrays is well known to those skilled in the art. The additional bit may also be used in testing. The four delay segments therefore have a total of 256 different programmable delays.

In another embodiment of the timing vernier the four fine programming bits are slightly different. One will be configured to have C/4−20%, one C/4, one C/4+20% and one C/4+40%. The programming sequence will be slightly different.

During calibration, it will be determined which of the 4 different fine bits is optimally used to provide monotonicity in the delay. The programming sequence will be the selected fine bit from block 220, the selected fine bits from block 220 and 230, the selected fine bits from blocks 220, 230 and 240, a course bit from any block, the aforementioned course bit plus the selected fine bit from block 220 and so on up to all 64 course bits.

In order to subdivide the clock into 256 equal segments, 255 division points must be inserted into the clock period. Thus programming a 0 will result in a pulse that is coincident with the rising edge of the clock. Programming a 1 (one fine bit) will result in a pulse that occurs $1/256$ of a clock period after the rising edge of the clock. Programming a 3 (three fine bits) will result in a pulse that occurs $3/256$ of a clock period after the rising edge of the clock. Programming a 4 (one course bit) will result in a pulse that occurs $4/256$ of a clock period after the rising edge of the clock. Programming a value of 255 (63 coarse bits and 3 fine bits) will result in a pulse that occurs $255/256$ of a clock period after the rising edge of the clock. Programming all of the 64 coarse bits will give a pulse that occurs exactly 1 clock period after the rising edge of the clock (in other words coincides with the next rising edge of the clock). This is the full range of programming and is used to program the maximum delay line shown in FIG. 1 (130).

Figure 4:
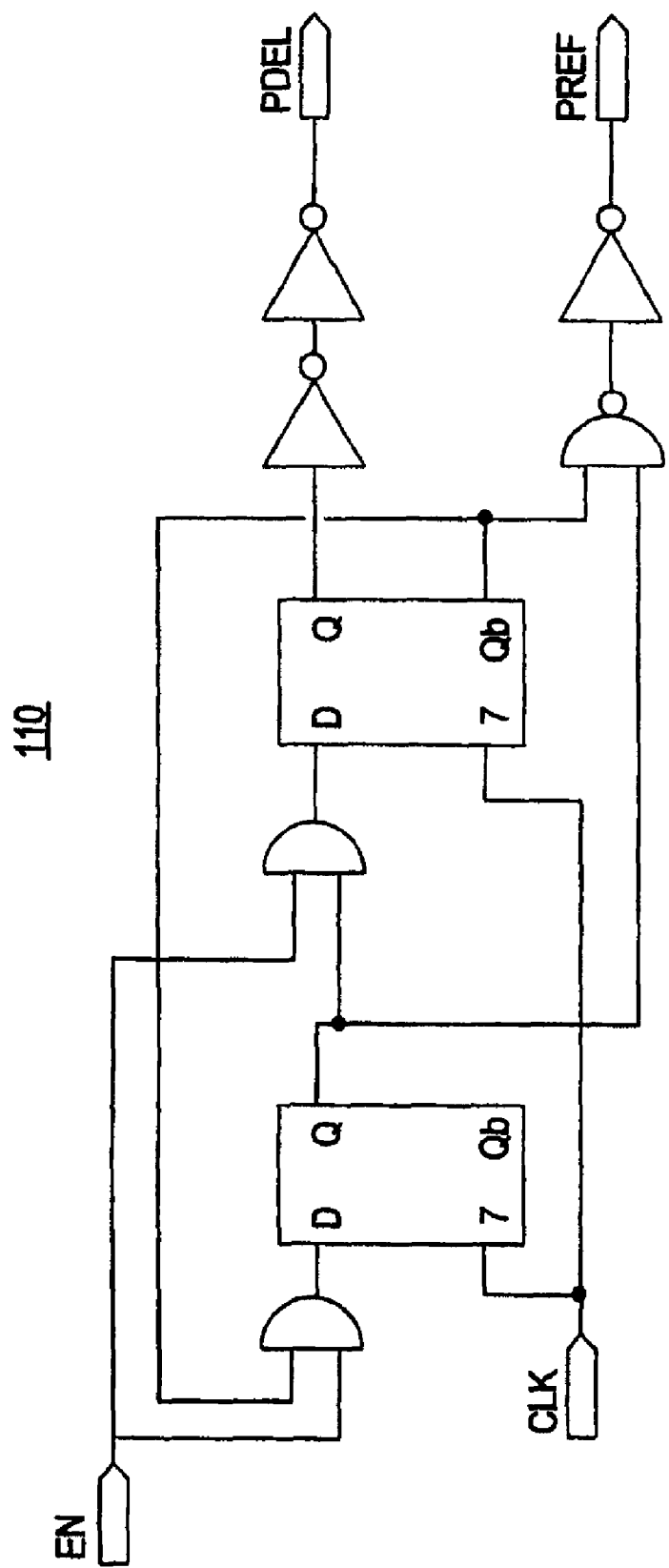
FIG. 4 is a circuit diagram of a pulse generator according to an embodiment of the present invention.

Referring to FIG. 4 there is shown a schematic diagram of the pulse generator 110. This pulse generator results in the PREF pulse and the DP pulse in every four clock cycles, as shown in FIG. 5. It is assumed that pulses PREF and DP are non-overlapping.

Figure 6:
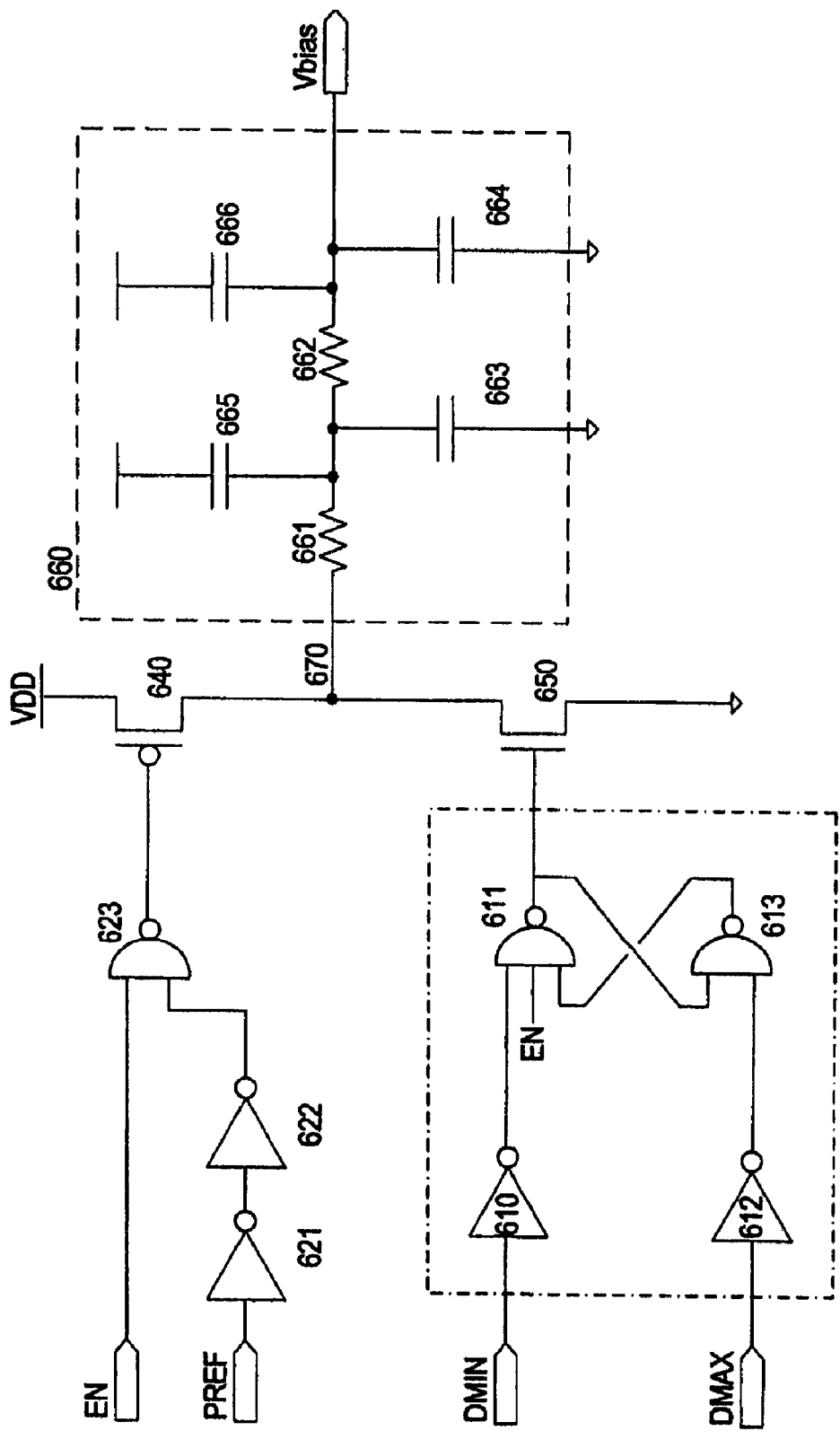
FIG. 6 is a circuit diagram of functional blocks shown in FIG. 1.

Referring to FIG. 6 there is shown a schematic diagram of preferred embodiments of the SR flip-flop 140 of FIG. 1, the duty-cycle detector 1 and charge-pump 660. In essence the functions of the duty cycle detector and charge pump have been combined in a single circuit.

An enable signal is coupled via an input of a NAND gate 623 to the gate of transistor 640, which is in turn coupled between a VDD supply and a node 670. When the enable signal EN is low, the circuitry is disabled and the node 670 is pulled to ground. When the signal EN is high the circuitry is enabled. The signal PREF is also coupled via the second input of the NAND gate 623 to the gate terminal of transistor 640. When signal PREF is high, the gate of transistor 640 will be low. This means that transistor 640 will be on. Charge will flow from the node VDD through transistor 640 and will be added to node 670. The voltage on node 670 will rise. When signal PREF is low, transistor 640 will be off and no charge will flow from VDD to node 670.

The SR flip-flop is a well known circuit formed by a pair of cross-coupled NAND gates 611, 613 and respective inverters 610, 612. The output of the flip-flop DP is coupled to the gate of a transistor 650 coupled between the node 670 and ground. When signal DMIN goes high the SR latch will set signal DP high. This will put a high on the gate of transistor 650, turning it on. Charge will be removed from node 670 through transistor 650 to the ground node. The voltage on node 670 will fall. Later signal DMIN will return low and signal DMAX will go high. This causes signal DP to go low which will turn off transistor 650.

Transistors 640 and 650 are sized such that the same amount of current flows when they are turned on. That is if both transistors 640 and 650 were on at the same time then the amount of charge being added to node 670 through transistor 640 would be the same as the amount removed from node 670 by transistor 650. Those skilled in the art will recognize that transistor 640 is typically 2.5× to 3× larger than transistor 650 to balance the charging and discharging currents.

Resistors 661 and 662 and capacitors 663, 664, 665 and 666 form a smoothing filter. The voltage on node 670 will see sudden decreases and increases in voltage as transistors 640 and 650 add and remove charge. The smoothing filter reduces the effect of this voltage change and voltage node VBIAS will preferably have a 60 mV ripple or smaller. The filter responds relatively quickly so as not to create instability in the loop.

Bias filter 190 (FIG. 1) is of similar construction to filter 660. However the component values are different. Filter 190 has a slower response and removes the ripple from VBIAS.

If the DP signal is high for longer than the PREF signal, transistor 650 will be on for longer than transistor 640. More charge will be removed from node 670 by transistor 650 than is added by transistor 640. The average voltage on node 670 will decrease. This lower average voltage will be reflected in the Vbias. The lower Vbias will increase the current through transistor 310 (FIG. 5), which will result in a shorter delay through the delay segments. The DMAX signal will be earlier and the DP pulse will be shorter.

Conversely if signal PREF is high for longer than signal DP, transistor 640 will be on for longer time than transistor 650 and this will occur during each fourth clock period. More charge will be added to node 670 by transistor 640 than is removed by transistor 650. The average voltage on node 670 will rise. This higher average voltage will be reflected in the Vbias. The higher Vbias will decrease the current through transistor 310, which will result in a longer delay through the delay segments. The DMAX signal will be delayed and the DP pulse will be longer.

The circuit of FIG. 6 compares the duty cycle of the DP pulse to that of the PREF pulse and then adjusts the Vbias until the DP and the PREF pulses have the same length.

Figure 7:
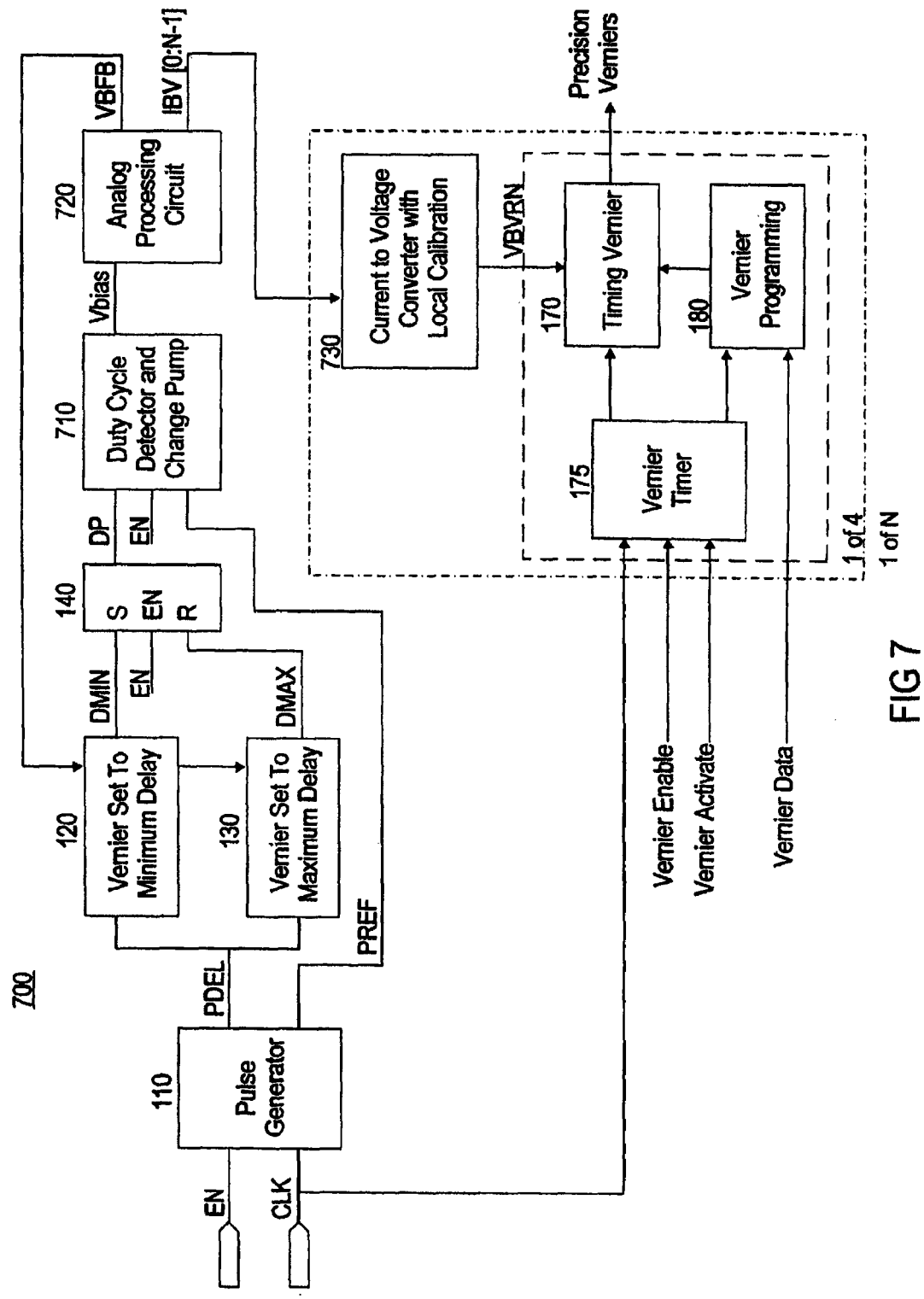
FIG. 7 is a schematic diagram of showing a further embodiment of the present invention.

Referring to FIG. 7 there is shown a schematic diagram of another embodiment of the invention. This embodiment is less susceptible to power supply fluctuations than the embodiment shown in FIG. 1. As shown, circuit blocks 110, 120, 130, 140, 170 and 180 are the same as for the corresponding blocks in FIG. 1 and bear the same numeric reference. However the duty cycle detector and the charge pump are combined in Block 710. An output voltage signal Vbias from the block 710 is provided to an analog processing block 120 which generates the voltage signal VBFB and the current signals IBV[0:N−1].

In addition each vernier 170 receives its clocking from a vernier timer block 175. The verniers 170 and their corresponding vernier programming circuit 180 are grouped in blocks of four. Each group of four verniers has a local current to voltage converter with local calibration circuit 730 to produce a local vernier bias voltage VBVRN.

It is a well-known phenomenon that the supply voltage on an integrated circuit can vary. This variation is due in part to the resistance of the power supply buses and the current flowing through the bus. The external power supply may also vary. The supply voltages may vary by as much as 10% across the chip. In the circuit shown in FIG. 1, a variation in the supply voltages in the timing verniers can result in a variation in the current supplied through transistor 310 (FIG. 3) in the various verniers. This will lead to slightly different delays. In a precision timing system these variations are undesirable.

The circuit of FIG. 7 includes a current to voltage converter 730 for converting reference current distributed to the local blocks of verniers into the bias voltage VBVRN. The local current to voltage converter will set up a local vernier bias voltage that compensates for any variation in the supply voltage. A local calibration is also provided in block 730 to compensate for other local factors.

Figure 8:
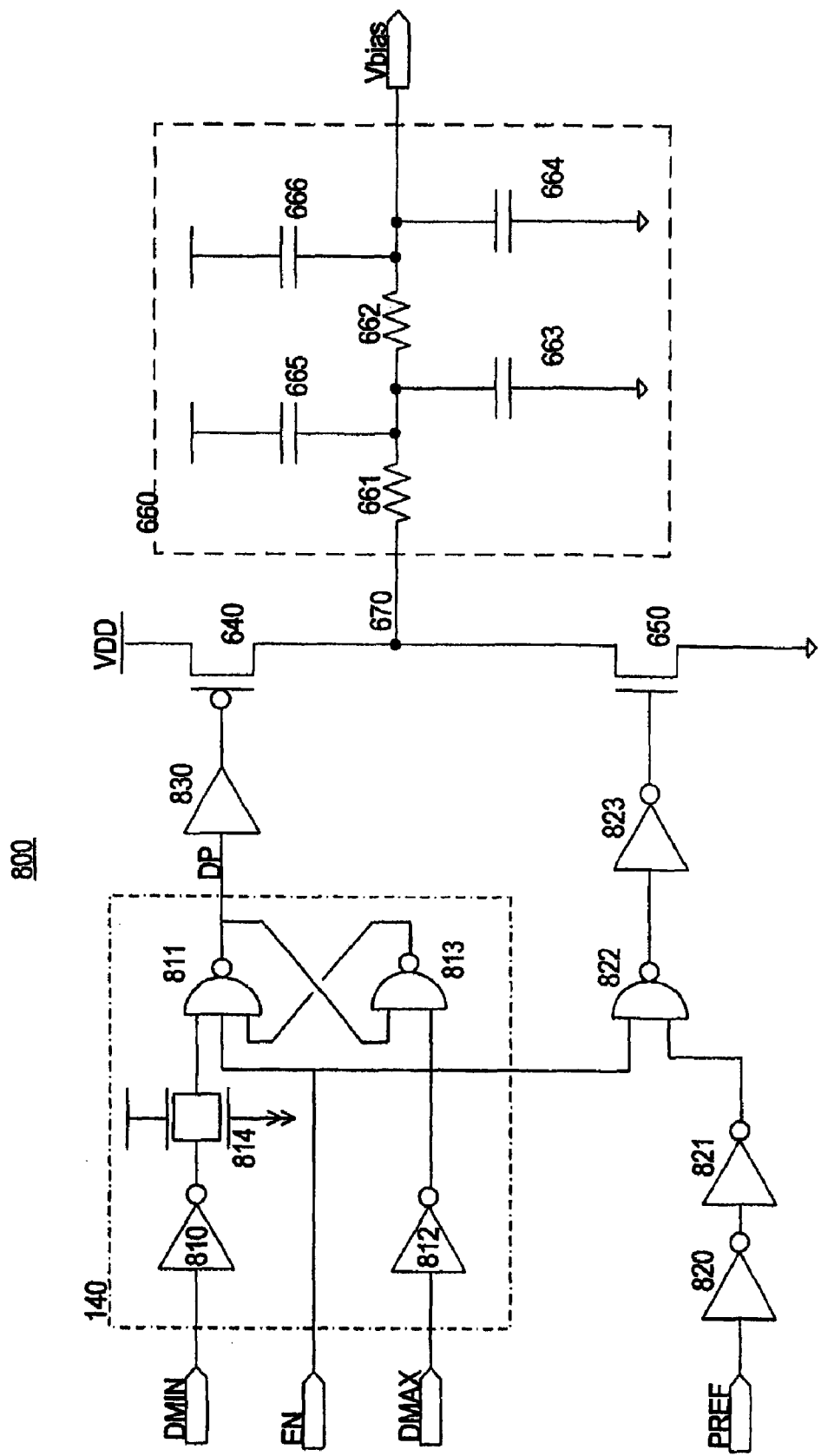
FIG. 8 is a circuit diagram of a duty cycle detector and charge pump circuit according to the second embodiment of the invention.

FIG. 8 is a schematic diagram of the duty cycle detector and charge pump 710 of FIG. 7. The charge pump is similar to that of shown in FIG. 6 except that the polarity of the charge pump has been reversed and some of the schematic chains implemented differently. Gates 810, 811, 812, 813 and 814 form a SR latch that corresponds to block 140 shown in FIG. 7. When the DP pulse is high then transistor 640 is on and charge is added to node 670. When signal PREF is high, then transistor 650 is on and charge is removed from node 670. Signal PREF transits 4 gates 820, 821, 822 and 823 prior to activating transistor 650. Transmission gate 814 is inserted in the DMIN path (gates 810, 814, 811 and 830) so that it also has 4 gate delays prior to activating transistor 640. This technique of inserting transmission gates to equalize the delay through different paths is well known in the art.

Figure 9:
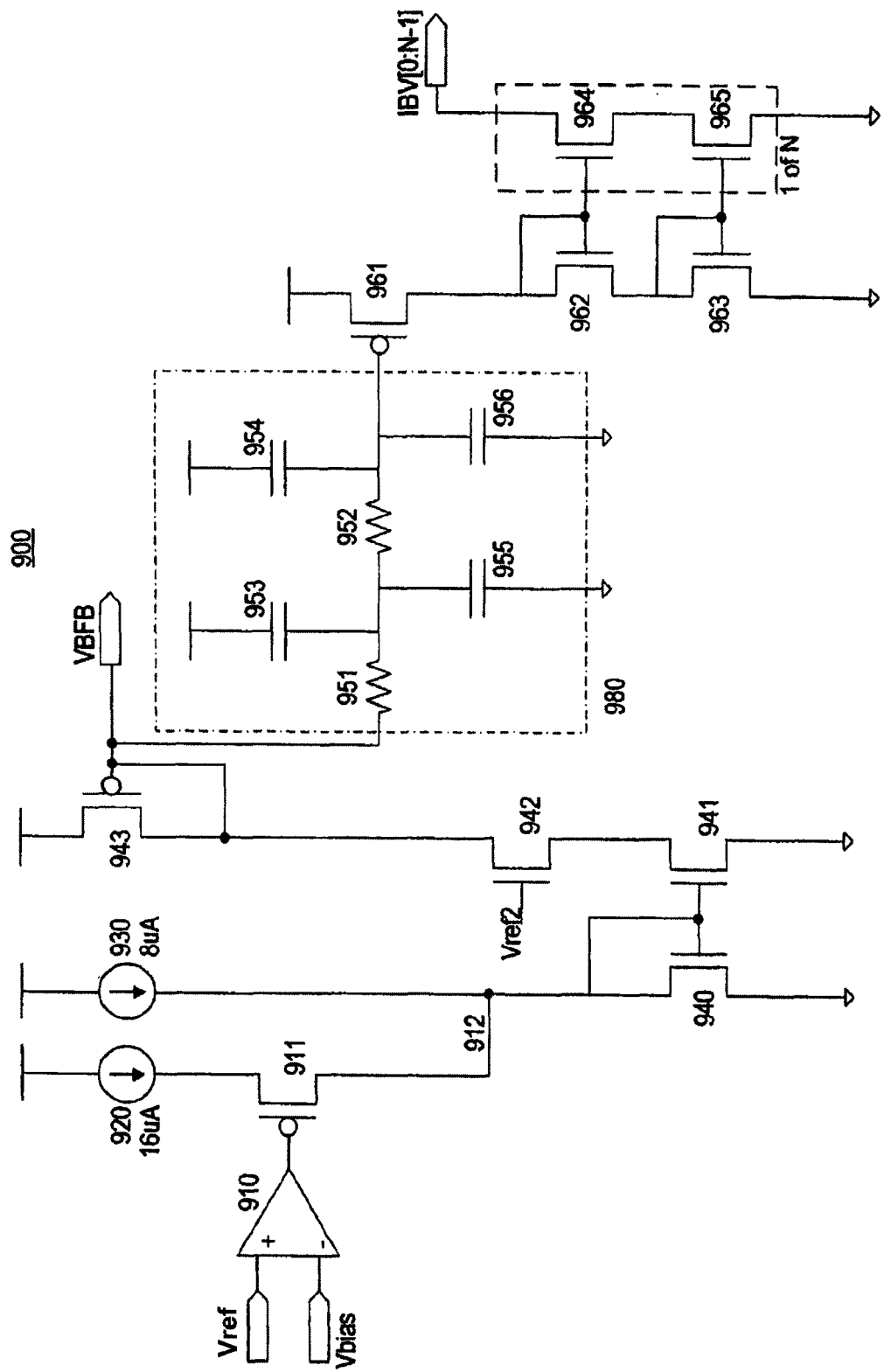
FIG. 9 is a circuit diagram of an analog processing circuit.

FIG. 9 is a schematic diagram of the analog processing circuit 720 shown in FIG. 7. The bias voltage Vbias is compared to a reference voltage Vref by differential amplifier 910. The output of the differential amplifier drives a gate of a transistor 911. The reference voltage Vref is preferably equal to VDD/2 and locally generated. If Vbias is greater than Vref then the output of the 910 will be low. This will turn on transistor 911 and allow current source 920 connected to its source-drain circuit to add its current to a node 912 in addition to the current supplied by current source 930. If Vbias is less than Vref the output of the differential amplifier 910 will be high and transistor 911 will be off. Only the current from current source 930 will be added to node 912. Current source 920 is configured to deliver 16 µA and 930 is configured to deliver 8 µA. Thus either 8 µA or 24 µA is supplied to node 912. This current flows through transistor 940 and is mirrored in transistors 941 and 942 and 943. The voltage on node VBFB will therefore either be one of two levels. The first level will be that which is sufficient for 8 µA to flow through transistor 943 and the other will be that which is sufficient for 24 µA to flow through transistor 943.

Signal VBFB is used as the feedback signal to close the loop. One skilled in the art will realize that excess filtering of the feedback signal will slow the response and cause potential instability. Therefore signal VBFB is used for the feedback and the filtered VBFB is used to generate the IBV currents.

Filter 950 is comprised of resistors 951 and 952 and capacitors 953, 954, 955 and 956. It will average out the voltage variations of node VBFB and provide that value to the gate of 961. Transistor 961 will conduct a current between 8 µA and 24 µA. This will be mirrored by the cascaded NMOS current mirrors made by transistors 962, 963, 964 and 965. There are N current mirrors, each generating an IBV bias current. Each IBV current is connected to a group of four timing verniers.

Figure 10:
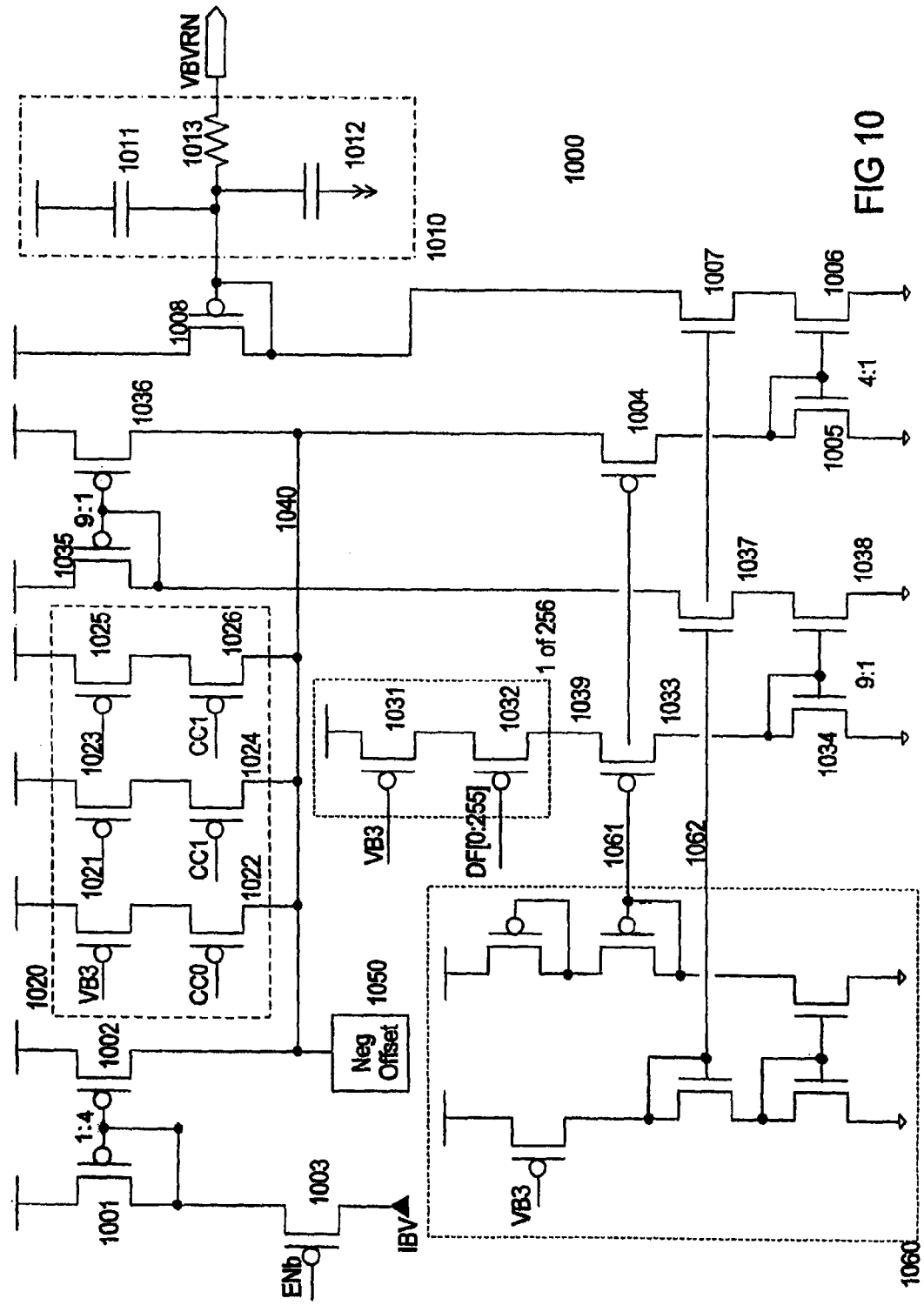
FIG. 10 is a circuit diagram of current to voltage converter according to the present invention.

FIG. 10 is a schematic diagram of the current to voltage converter with local calibration (block 730). This circuit combines the vernier bias current IBV with a coarse adjustment and a fine adjustment circuit. Node 1040 is a current summing node and it combines the bias current with the coarse and fine adjustment circuits.

Current IBV is mirrored by the current mirror formed by transistors 1001 and 1002. Transistor 1002 is preferably four times (4×) larger than transistor 1001. This has the effect of adding 4× IBV to node 1040. The current is increased by a factor of four and then later decreased by a factor of four. This allows the current summing to occur at easily controllable levels. Very small currents are difficult to reliably generate.

The coarse adjustment circuit (1020) consists of eight pairs of PMOS transistors. One such pair consists of series connected transistors 1021 and 1022. Device 1021 has its gate connected to a locally generated bias voltage VB3. Transistor 1022 has its gate connected to coarse programming signal CC0. If signal CC0 is low then transistor 1022 is on, and a current defined by the bias voltage VB3 is added to node 1040. Similarly devices 1023 and 1024 form a pair as do devices 1025 and 1026. Three such pairs are shown but there are preferably eight pairs controlled by signals CC[7:0]. Other embodiments may have more or fewer pairs. The coarse adjustment circuit is preferably only used in testing.

The fine adjustment circuits comprise 256 pairs of transistors 1031 and 1032 and transistors 1033 to 1038. Similar to the coarse adjustment circuit the 256 pairs of transistors combine a current onto node 1039. This current is mirrored by current mirror 1034/1038. The range of the fine adjustment circuits is approximately equal to a coarse step. Transistor 1038 is preferably ⅑ the size of transistor 1034 so the current flowing through transistor 1038 is ⅑ that of transistor 1034. Current mirror 1035/1036 is also a 1:9 ratio so that the current added to node 1040 is 1/81 that of node 1039. Negative offset block 1050 subtracts a small amount of current from node 1040. The negative offset circuit preferably subtracts ½ the current of a coarse programming bit. The fine adjustment circuit compensates for this and requires a mid range setting (128 of 256 bits). This permits the current to be trimmed both + and − from the nominal.

The summed currents of node 1040 are mirrored by current mirror 1005/1006. Device 1006 is preferably ¼ the size of 1005. This returns the current levels to that of the original current IBV.

Transistor 1008 converts the current to a bias voltage, which is filtered by filter 1010 prior to distribution to the 4 local timing verniers.

Bias generating circuit 1060 generates local bias voltages 1061 and 1062 from bias voltage VBDAC.

Someone skilled in the art will realize that there are a number of elements not shown in FIG. 10. Specifically these elements set the nodes of the circuit to a known value in a disabled state. In this disabled state a minimum amount of power is dissipated. These elements are omitted for clarity.

Figure 11:
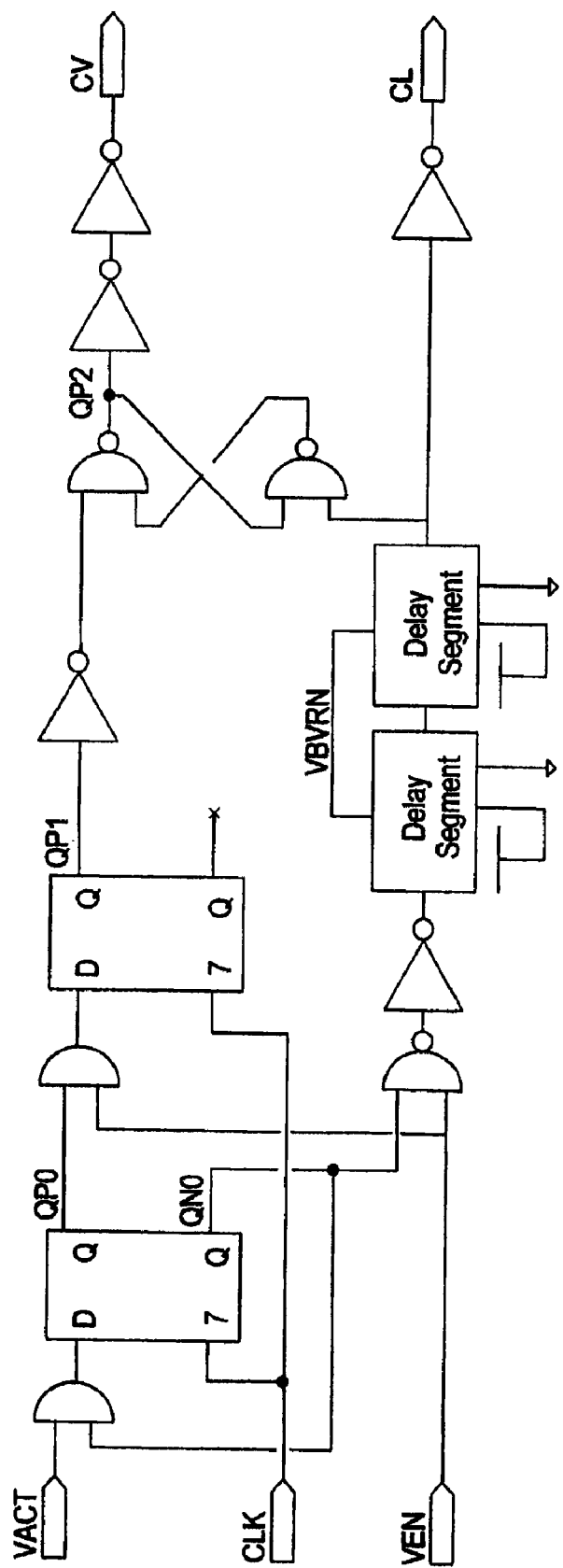
FIG. 11 is a circuit diagram of a variable delay circuit.

Returning to FIG. 7, the vernier timer circuit 175 has been added to control the timing pulses of the timing vernier and its programming block. It is conceivable that the vernier could be programmed to maximum delay on one clock and minimum delay on the next. This would result in contention as the pulses would overlap and the programming changes would not have time to be implemented. Block 175 restricts the vernier to 1 pulse every two clock cycles. A circuit suitable for implementing this function is shown in FIG. 11. A variable delay circuit in FIG. 11 is comprised of two delay segments of the type shown in FIG. 2. They receive the bias voltage VBVRN of the local verniers. The programming is set through metal mask options. The shaded area on FIG. 12 shows the programming range of this variable delay. The data for the next vernier programming is latched on the rising edge of signal CL.

FIG. 12 shows the timing operation of this circuit. Also shown on FIG. 12 is the Vernier Output signal. The first pulse is a pulse programmed to a value 0 and the second is programmed to a value of 255.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. An apparatus comprising:
   first delay circuitry configured to delay an input signal by a first duration and a second duration concurrently where the first duration and the second duration are adjustable by a first control signal, to provide a pulsed signal having a duration corresponding to a difference between the first duration and the second duration;
   a comparator configured to compare the duration of the pulsed signal to a reference pulse signal duration to produce a comparison output signal, in response to the comparison output signal, the first delay circuitry changing the duration of the pulsed signal to substantially correspond to the reference pulse signal duration; and
   second delay circuitry configured to delay the input signal to provide a delayed input signal in response to a second control signal, the first control signal and the second control signal electrically corresponding to each other.

2. A method for producing a timing signal, comprising:
   delaying an input signal by a first duration and a second duration concurrently where the first duration and the second duration are adjustable by a first control signal, to provide a pulsed signal having a duration corresponding to a difference between the first duration and the second duration;
   comparing the duration of the pulsed signal to a reference pulse signal duration to produce a comparison output signal, in response to the comparison output signal, changing the duration of the pulsed signal to substantially correspond to the reference pulse signal duration; and
   delaying the input signal to provide a delayed input signal in response to a second control signal, the first control signal and the second control signal electrically corresponding to each other.

3. A system for providing a delayed signal in response to an input signal, the system comprising:
   a pulse provider for providing a pulsed signal in response to the input signal, the pulsed signal having an adjustable pulse duration, the adjustable pulse duration being associated with a delayed version of the input signal and being adjustable by a first control signal;
   a comparator for comparing the adjustable pulse duration and a reference pulse signal duration and for adjusting the first control signal to change the adjustable pulse duration to substantially correspond to the reference pulse signal duration; and
   timing circuitry for delaying the input signal to provide a the delayed input signal in response to the first control signal.

4. The method of claim 2, wherein
   the first duration corresponds to a minimum duration, the second duration corresponds to a maximum delay; and
   the input signal is delayed by a first control vernier that is programmed to delay the input signal with the minimum delay, and the input signal is delayed by a second control vernier that is programmed to delay the input signal with the maximum delay.

5. The method of claim 2, wherein the input signal delayed by the first duration corresponds to a first delayed signal and the input signal delayed by the second duration corresponds to the second delayed signal, and the pulsed signal is provided in response to active edges of the first delayed signal and the second delayed signal.

6. The method of claim 2, wherein the input signal and the reference pulse signal are provided in response to a clock signal.

7. The method of claim 6, further comprising
   dividing the clock signal by an integer value i, the input signal being the clock signal divided by i.

8. The method of claim 6, wherein the reference pulse signal has a duration corresponding to one clock cycle of the clock signal.

9. The method of claim 2, further comprising
   adjusting a voltage level of the first control signal in response to the reference pulse signal duration and the duration of the pulsed signal.

10. The method of claim 9, further comprising
    charging the first control signal to a supply voltage during the reference pulse signal duration; and
    discharging the first control signal to a ground voltage for the duration of the pulsed signal.

11. The method of claim 2, further comprising
    filtering the first control signal to provide the second control signal.

12. The method of claim 2, further comprising
    providing a bias voltage in response to the reference pulse signal duration and the duration of the pulsed signal, the first control signal having substantially the same voltage level as the bias voltage.

13. The method of claim 12, wherein the first control signal is provided in response to the bias voltage and a bias current, the second control signal electrically corresponding to the bias current.

14. The method of claim 13, further comprising
    converting the bias current into the second control signal, the second control signal being a voltage corresponding to the bias current.

15. The system of claim 3, further comprising
    a first control vernier for delaying the input signal by a first duration and in response to the first control signal to provide a first delayed signal, and
    a second control vernier for delaying the input signal by the second duration and in response to the first control signal to provide a second delayed signal.

16. The system of claim 15, wherein:
    the first control vernier is programmable to delay the input signal with a minimum delay, and
    the second control vernier is programmable to delay the input signal with a maximum delay.

17. The system of claim 15, wherein the pulsed signal is provided in response to active edges of the first delayed signal and the second delayed signal.

18. The system of claim 15, wherein the input signal and the reference pulse signal are provided in response to a clock signal.

19. The system of claim 18, wherein the pulse generator is configured to divide the clock signal by an integer value i, the input signal being the clock signal divided by i.

20. The system of claim 18, wherein the pulse generator is configured to provide the reference pulse signal having a duration corresponding to one clock cycle of the clock signal.

21. The system of claim 3, wherein the comparator includes a charge pump for adjusting a voltage level of the first control signal in response to the reference pulse signal duration and the duration of the pulsed signal.

22. The system of claim 21, wherein the charge pump is configured for charging the first control signal to a supply voltage during the reference pulse signal duration, and for discharging the first control signal to a ground voltage for the duration of the pulsed signal.

23. The system of claim 3, wherein the comparator includes a charge pump for providing a bias voltage in response to the reference pulse signal duration and the duration of the pulsed signal, the first control signal having substantially the same voltage level as the bias voltage.

24. The system of claim 23, further including a filter for filtering the first control signal to provide a second control signal and wherein the delayed signal is provided in response to the second control signal.

25. The system of claim 24, wherein the comparator includes an analog processing circuit for providing the first control signal in response to the bias voltage and a bias current, the second control signal electrically corresponding to the bias current.

26. The system of claim 25, wherein the timing circuitry includes a converter for converting the bias current into the second control signal, the second control signal being a voltage corresponding to the bias current.

27. The system of claim 3, wherein the timing circuitry includes a veriner programming circuit to program a delay range of the timing circuitry.

28. The system of claim 27, wherein the vernier programming circuit provides a programming control signal in response to a clock signal and a vernier delay code data.

29. The system of claim 28, wherein the delayed signal provided by the timing circuitry is controlled by the first control signal and the programming control signal.

30. The system of claim 28, wherein the vernier programming circuit includes registers and a decoder to receive the vernier delay code data and to generate the programming control signal.

* * * * *